United States Patent [19]

Rapp

[11] Patent Number: 5,280,420
[45] Date of Patent: Jan. 18, 1994

[54] CHARGE PUMP WHICH OPERATES ON A LOW VOLTAGE POWER SUPPLY

[75] Inventor: A. Karl Rapp, Los Gatos, Calif.

[73] Assignee: National Semiconductor Corporation, Santa Clara, Calif.

[21] Appl. No.: 955,939

[22] Filed: Oct. 2, 1992

[51] Int. Cl.$^5$ .............................................. H02M 3/06
[52] U.S. Cl. .................................... 363/60; 363/59
[58] Field of Search ............... 363/59, 60; 307/109, 307/110

[56] References Cited

U.S. PATENT DOCUMENTS

| | | | |
|---|---|---|---|
| 4,839,787 | 6/1989 | Kojima et al. | 363/60 |
| 4,922,402 | 5/1990 | Olivo et al. | 363/60 |
| 4,935,644 | 6/1990 | Tsujimoto | 307/296.2 |
| 5,008,799 | 4/1991 | Montalvo | 307/110 |
| 5,029,063 | 7/1991 | Lingstaedt et al. | 363/60 |
| 5,059,815 | 10/1991 | Bill et al. | 363/60 |
| 5,216,588 | 6/1993 | Bajwa et al. | 363/60 |
| 5,245,524 | 9/1993 | Nakagawa et al. | 363/62 |

OTHER PUBLICATIONS

John F. Dickson, "On-Chip High-Voltage Generation in MNOS Integrated Circuits Using an Improved Voltage Multiplier Technique" IEEE Journal of Solid-State Circuits, vol. SC-11, No. 3, Jun. 1976, pp. 374-378.

National Semiconductor, "Memory Databook", Dec. 1992 Edition, pp. 1-40 through 1-51, NM27C256 EPROM.

*Primary Examiner*—Jeffrey Sterrett
*Attorney, Agent, or Firm*—Limbach & Limbach

[57] ABSTRACT

A charge pump for increasing the amplitude of a voltage supply signal is disclosed. The charge pump includes an auxiliary pump, a buffer stage, and a main pump. The auxiliary pump generates several intermediate voltage signals in response to a pair of complementary clock signals. Each intermediate voltage signal has a different amplitude which is greater than the amplitude of the voltage supply signal. The buffer stage increases the amplitudes of the pair of complementary clock signals in response to the several intermediate voltage signals generated by the auxiliary pump. The main pump increases the amplitude of the voltage supply signal in response to the pair of increased amplitude complementary clock signals generated by the buffer stage.

20 Claims, 5 Drawing Sheets

CHARGE PUMP WHICH OPERATES ON A LOW VOLTAGE POWER SUPPLY

BACKGROUND OF THE INVENTION

1. Field of the Invention

The present invention relates to charge pumps used for providing high voltages to digital memories, and more particularly, to charge pumps which operate on low voltage power supplies.

2. Description of the Related Art

Many non-volatile digital memories, such as EEPROMs, EPROMs, and FLASH memories, require relatively high voltage potentials in order to write or erase information. Typically, the required voltage is approximately 12-20 Volts. Because the power supplies of most digital systems supply a much lower voltage, such as 2-5 Volts, various methods of high-voltage generation have been used to "pump up" the supply voltage to the potential required by non-volatile memories.

FIG. 1 illustrates a conventional charge pump 20, a device, well known in the art, used for high-voltage generation. The charge pump 20, which is also referred to as a voltage multiplier, increases (or "pumps up") the amplitude of the voltage supply signal Vcc to the programming/erase voltage Vpp required by non-volatile memories.

The charge pump 20 is made up of several series-connected pump stages 22, 24, 26, and 28. Pump stage 28 represents the nth pump stage. Each pump stage 22, 24, 26, and 28 is respectively made up of capacitors C2, C3, C4, and Cn connected to the respective anodes of diodes D2, D3, D4, and Dn. The voltage supply signal Vcc is coupled through a diode D1 to the anode of diode D2 of pump stage 22. The pumped up voltage signal Vpp is received from the cathode of diode Dn of pump stage 28. Each pump stage 22, 24, 26, and 28 is coupled to one of a pair of complementary clock signals $\Phi_1$ and $\Phi_2$ through capacitors C2, C3, C4, and Cn, respectively.

During operation, the capacitors C2, C3, C4, and Cn are successively charged and discharged during each half of the clock signal. Specifically, capacitor C2 is charged through diode D1 as clock signal $\Phi_1$ goes low; capacitor C4 is charged via the path through capacitor C3, diode D3 and positive-going clock $\Phi_2$ at the same time. Charge is transferred from capacitor C2 to capcitor C3 through diode D2 when the clocks reverse polarity. Charge transfer is constrained by the diodes to be from left to right.

As the capacitors C2, C3, C4, and Cn are successively charged and discharged, packets of charge are "pumped" along the diode chain D2, D3, D4, and Dn. The average voltage potential at the cathodes of diodes D2, D3, D4, and Dn increases progressively from the input to the output of the diode chain. Thus, the voltage signal generated at the cathode of diode Dn has a greater amplitude than the voltage supply signal Vcc.

When the voltage supply signal is 5 Volts, the charge pump 20 is sufficient for generating the high voltages required by non-volatile memories. In this scenario, approximately 10 pump stages are utilized. Furthermore, it is common for diodes D2, D3, D4, and Dn, and capacitors C2, C3, C4, and Cn, to be implemented with diode-connected and capacitor-connected MOS transistors.

Many of today's digital systems, however, such as portable computers, have power supplies that supply voltages less than 5 Volts. Charge pumps designed for 5 Volt supplies are inadequate for low voltage power supplies for two reasons. First, additional pump stages are required because the incremental voltage increase per stage is small. As the number of pump stages increases, the effective resistance of the charge pump increases, which limits the amount of current that can be supplied to the non-volatile memories. Second, a phenomenon known as "body effect" (or "M factor") causes the effective threshold voltages of the capacitor-connected transistors in the upper pump stages to increase. Because the clock signals have small amplitudes, body effect causes the transistor conductance to decrease. As conduction of the transistors decreases, the upper pump stages become highly resistive, which severely limits current.

FIG. 2 illustrates a prior art attempt to solve the inadequacies of conventional charge pumps when used with low voltage power supplies. A first-stage charge pump 30, which has the same general design as charge pump 20, is powered by a 2 Volt power supply signal Vcc. A first oscillator 32, which is also powered by Vcc, generates a pair of complementary clock signals $\Phi_1$ and $\Phi_2$ for use by first-stage charge pump 30. The output Vo of first-stage charge pump 30 is used as the power supply signal for a second oscillator 34. The second oscillator 34 generates a pair of complementary clock signals $\Phi_1+$ and $\Phi_2+$ for use by second-stage charge pump 36. The second stage charge pump 36, which also has the same general design as charge pump 20, is powered by voltage supply signal Vcc.

During operation, first stage charge pump 30 increases ("pumps up") the amplitude of voltage supply signal Vcc, resulting in output signal Vo. Because output signal Vo is used as a power supply signal for second oscillator 34, complementary clock signals $\Phi_1+$ and $\Phi_2+$ have greater amplitudes than clock signals $\Phi_1$ and $\Phi_2$. Although second stage charge pump 36 is powered by low voltage supply signal Vcc, the clock signals $\Phi_1+$ and $\Phi_2+$, which have increased amplitudes, cause second stage charge pump 36 to increase ("pump up") the voltage supply signal Vcc more than usual. Thus, a programming/erase voltage signal Vpp in the 12-20 Volt range is produced.

The two-stage charge pump of FIG. 2 suffers from a number of disadvantages. First, two oscillators are required which increases the physical size of the pump and consumes additional power. Second, very large elements are required in the first-stage pump 30 in order to provide sufficient power to the second oscillator 34. The larger elements require more power from the first oscillator 32 which cause it to consume substantial quantities of power. Energy efficiency is very important in low voltage supply applications.

Thus, there is a need for a charge pump that can generate the high voltages required by non-volatile memories from a low voltage power supply without being unduly resistive, power consuming, or physically large.

SUMMARY OF THE INVENTION

The present invention provides a charge pump for increasing the amplitude of a voltage supply signal. The charge pump includes an auxiliary pump, a buffer stage, and a main pump. The auxiliary pump generates several intermediate voltage signals in response to a pair of complementary clock signals. Each intermediate voltage signal has a different amplitude which is greater than the amplitude of the voltage supply signal. The buffer stage increases the amplitudes of the pair of complementary clock signals in response to the several intermediate voltage signals generated by the auxiliary pump. The main pump increases the amplitude of the voltage supply signal in response to the pair of increased amplitude complementary clock signals generated by the buffer stage.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENTS

Figure 3:
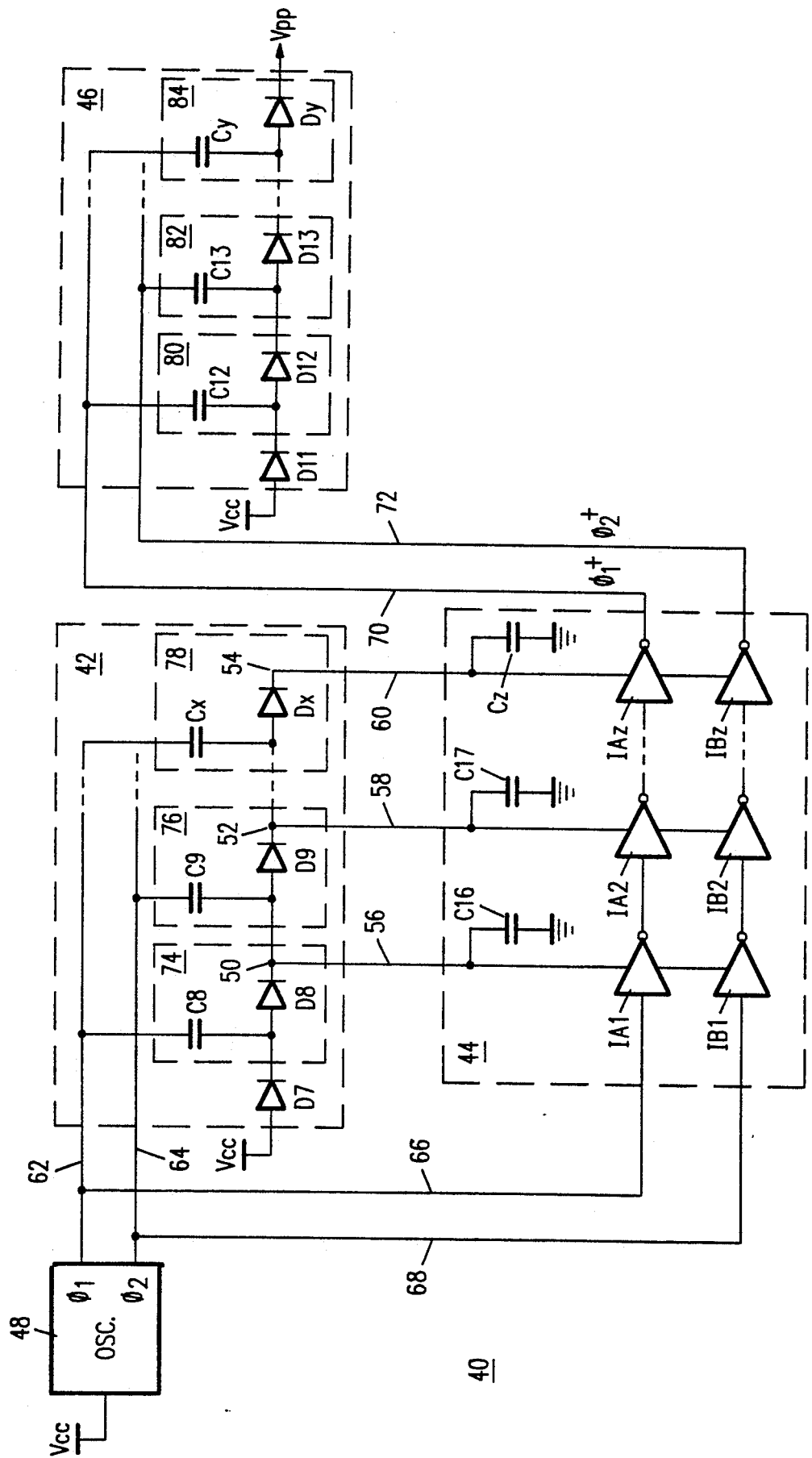
FIG. 3 is a schematic diagram illustrating a charge pump in accordance with the present invention.

Referring to FIG. 3, there is illustrated a circuit embodiment of a charge pump 40 in accordance with the present invention. The charge pump 40 is capable of increasing the amplitude of a low voltage power supply signal Vcc. For purposes of this invention, the low voltage power supply signal Vcc is a voltage signal that is less than 5 Volts. The resulting output signal is the high voltage programming/erase voltage signal Vpp that is required by non-volatile memories.

Generally, the charge pump 40 includes an auxiliary pump 42, a buffer stage 44, and a main pump 46. Only a single oscillator 48 is required by the charge pump 40. The oscillator 48, which is powered by the voltage supply signal Vcc, generates a pair of complementary clock signals $\Phi hd 1$ and $\Phi_2$.

The auxiliary pump 42 receives the pair of complementary clock signals $\Phi_1$ and $\Phi_2$ via lines 62 and 64. The function of the auxiliary pump 42 is to generate several intermediate voltage signals at nodes 50, 52, and 54 in response to the pair of complementary clock signals $\Phi_1$ and $\Phi_2$ and the voltage supply signal Vcc. Each of the intermediate voltage signals generated at nodes 50, 52, and 54 has a different amplitude which is greater than the amplitude of the voltage supply signal Vcc.

The buffer stage 44 receives the intermediate voltage signals generated at nodes 50, 52, and 54 via lines 56, 58, and 60, respectively. The function of the buffer stage 44 is to utilize the intermediate voltage signals received on lines 56, 58, and 60 to increase the amplitudes of the pair of complementary clock signals $\Phi_1$ and $\Phi_2$ to $\Phi_1+$ and $\Phi_2+$. The buffer stage 44 receives the complementary clock signals $\Phi_1$ and $\Phi_2$ via lines 66 and 68, respectively.

The main pump 46 receives the pair of increased amplitude complementary clock signals $\Phi_1+$ and $\Phi_2+$ via lines 70 and 72, respectively. The function of the main pump 46 is to utilize the pair of increased amplitude complementary clock signals $\Phi_1+$ and $\Phi_2+$ to increase the amplitude of the voltage supply signal Vcc resulting in programming/erase voltage signal Vpp.

Figure 1:
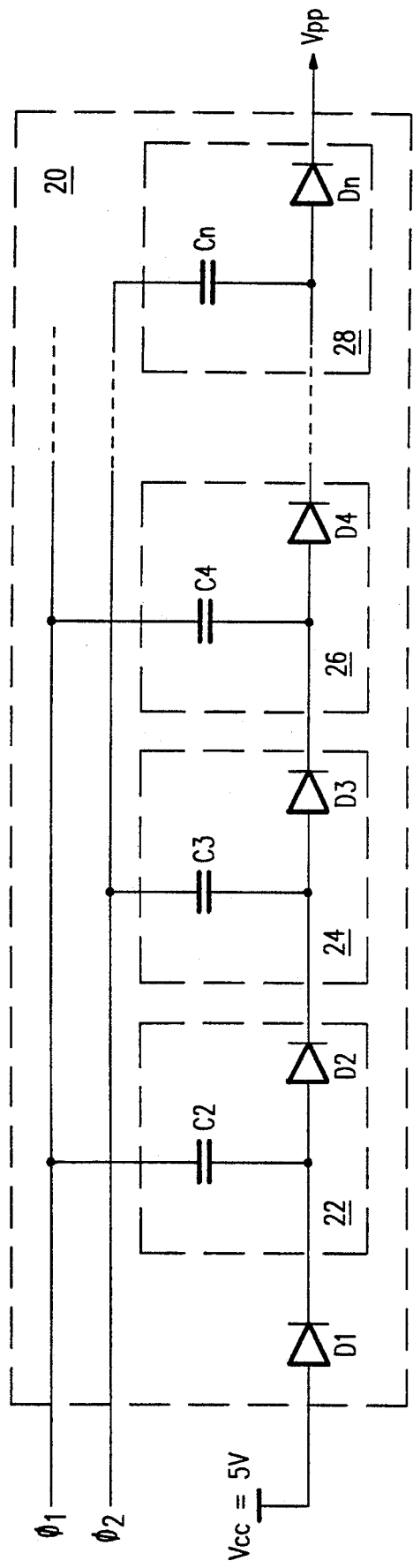
FIG. 1 is a schematic diagram illustrating a conventional charge pump.
Figure 2:
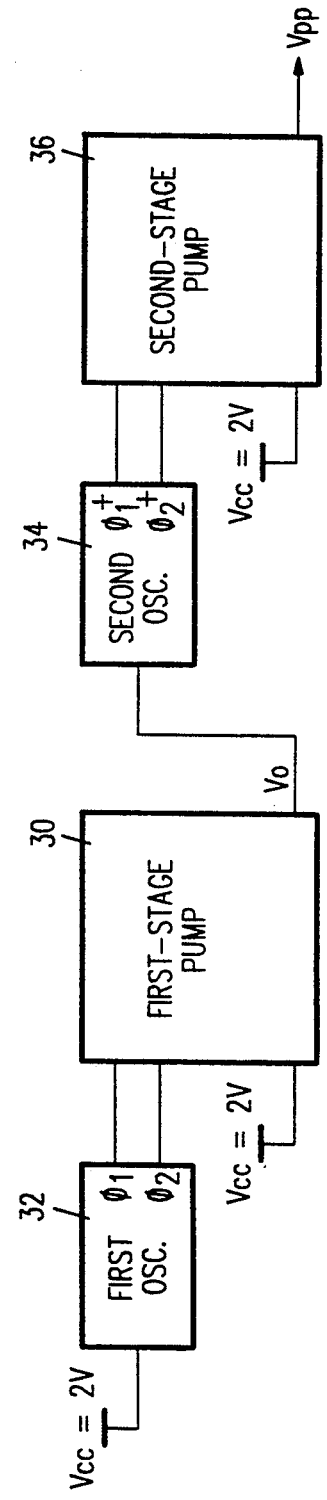
FIG. 2 is a block diagram illustrating a conventional two-stage charge pump.

The auxiliary pump 42 is similar to the charge pump 20 of FIG. 1 in that it is made up of several series-connected auxiliary pump stages 74, 76, and 78. Auxiliary pump stage 78 represents the xth auxiliary pump stage. Each auxiliary pump stage 74, 76, and 78 is respectively made up of capacitors C8, C9, and Cx connected to the respective anodes of series-connected diodes D8, D9, and Dx. The voltage supply signal Vcc is coupled through a diode D7 to the anode of diode D8 of pump stage 74. Each pump stage 74, 76, and 78 is coupled through capacitors C8, C9, and Cx, respectively, to one of the pair of complementary clock signals $\Phi_1$ and $\Phi_2$ carried by lines 62 and 64.

During operation, capacitors C8, C9, and Cx are successively charged and discharged which "pumps" packets of charge along the series-connected diodes D8, D9, and Dx. Diode D7 prevents charge from being pumped backwards into the voltage supply Vcc. The average potentials at nodes 50, 52, and 54 (the cathodes of diodes D8, D9, and Dx) increases progressively from the input to the output of the diode chain. Specifically, the average potential increases by $\Delta$ Volts per auxiliary pump stage. This increase results in the amplitude of the signal generated at node 50 being equal to Vcc+$\Delta$, the amplitude of the signal generated at node 52 being equal to Vcc+2$\Delta$, and the amplitude of the signal generated at node 54 being equal to Vcc+x$\Delta$. Thus, the amplitude of each of the intermediate voltage signals present at nodes 50, 52, and 54 is greater than the amplitude of voltage supply signal Vcc.

The main pump 46 is also similar to the charge pump 20 of FIG. 1. Main pump 46 is made up of several series-connected main pump stages 80, 82, and 84. Main pump stage 84 represents the yth main pump stage. Each main pump stage 80, 82, and 84 is respectively made up of capacitors C12, C13, and Cy connected to the respective anodes of series-connected diodes D12, D13, and Dy. The voltage supply signal Vcc is coupled through a diode D11 to the anode of diode D12 of main pump stage 80. The voltage supply signal having an increased amplitude Vpp is received from the cathode of diode Dy of main pump stage 84. Each main pump stage 80, 82, and 84 is coupled through capacitors C12, C13, and Cy, respectively, to one of the pair of increased amplitude complementary clock signals $\Phi_1+$ and $\Phi_2+$ carried by lines 70 and 72, respectively.

During operation, capacitors C12, C13, and Cy are successively charged and discharged which "pumps" packets of charge along the series-connected diodes D12, D13, and Dy. Diode D11 prevents charge from being pumped backwards into the voltage supply Vcc. The average potentials at the cathodes of diodes D12, D13 and Dy increases progressively from the input to the output of the diode chain. Thus, the voltage signal generated at the cathode of diode Dy, i.e., Vpp, has a greater amplitude than the voltage supply signal Vcc.

The buffer stage includes several buffers which are used to increase the amplitudes of the pair of complementary clock signals $\Phi_1$ and $\Phi_2$. Preferably, inverters are used as the buffers. Thus, the buffer stage 44 is made up of a first set of series-connected inverters IA1, IA2, and IAz, and a second set of series-connected inverters IB1, IB2, and IBz. The function of the first set of series-connected inverters IA1, IA2, and IAz is to increase the amplitude of complementary clock signal $\Phi_1$, and the function of the second set of series-connected inverters IB1, IB2, and IBz is to increase the amplitude of complementary clock signal $\Phi_2$.

Inverter IA1 receives at its input complementary clock signal $\Phi_1$ via line 66, and inverter IB1 receives at its input complementary clock signal $\Phi_2$ via line 68. Inverter IAz outputs increased amplitude complementary clock signal $\Phi_1+$ via line 70, and inverter IBz outputs increased amplitude complementary clock signal $\Phi_2+$ via line 72.

Each of the inverters in the first set of series-connected inverters IA1, IA2, and IAz is powered by a different one of the intermediate voltage signals generated by the auxiliary pump 42 at nodes 50, 52, and 54. Likewise, each of the inverters in the second set of series-connected inverters IB1, IB2, and IBz is powered by a different one of the intermediate voltage signals generated by the auxiliary pump 42 at nodes 50, 52, and 54. Thus, inverters IA1 and IB1 are powered by the intermediate voltage signal at node 50 via line 56, inverters IA2 and IB2 are powered by the intermediate voltage signal at node 52 via line 58, and inverters IAz and IBz are powered by the intermediate voltage signal at node 54 via line 60.

The buffer stage 44 also includes filter capacitors C16, C17, and Cz coupled between lines 56, 58, and 60 and ground potential, respectively. One purpose of the filter capacitors C16, C17, and Cz is to smooth out ripples in the intermediate voltage signals carried by lines 56, 58, and 60. Another purpose of the filter capacitors C16, C17, and Cz will be explained below.

During operation, inverters IA1, IA2, and IAz progressively increase the amplitude of complementary clock signal $\Phi_1$, and inverters IB1, IB2, and IBz progressively increase the amplitude of complementary clock signal $\Phi_2$. The amplitudes are increased because each successive inverter is powered by a voltage supply signal via lines 56, 58, and 60 having a greater amplitude than the voltage supply signal powering the previous inverter.

Preferably, CMOS inverters are used to implement the first and second set of series-connected inverters IA1, IA2, IAz, IB1, IB2, and IBz. However, it is believed that other types of inverters can be used to implement the inverters of the present invention.

Figure 4:
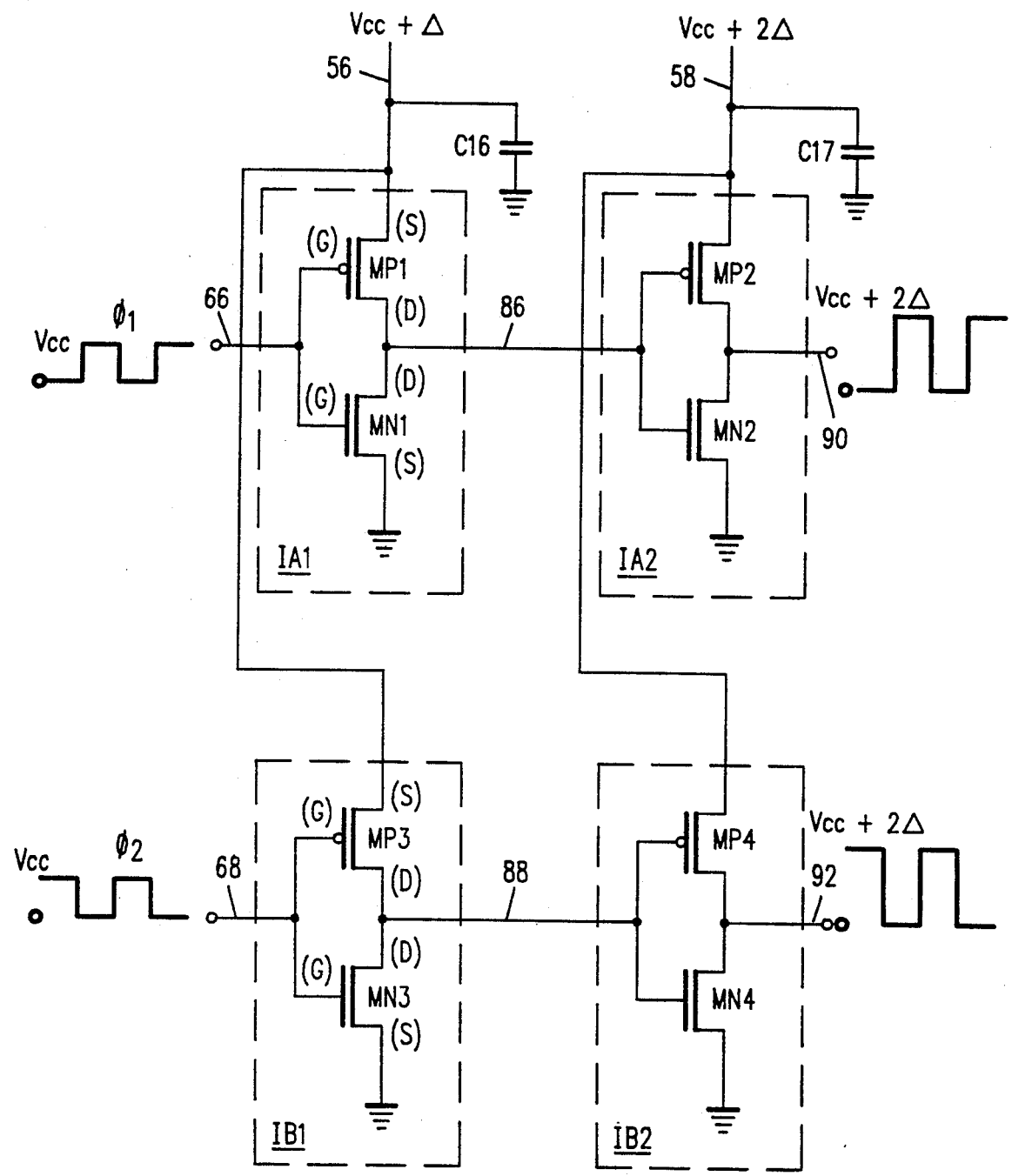
FIG. 4 is a schematic diagram illustrating the inverters shown in FIG. 3.

Referring to FIG. 4, there is illustrated a schematic diagram of CMOS implementations of inverters IA1, IA2, IB1, and IB2 Inverter IA1 includes p-channel MOS transistor MP1 and n-channel MOS transistor MN1. The gates of transistors MP1 and MN1 are both connected to line 66 which carries complementary clock signal $\Phi_1$. The source of transistor MP1 is connected to line 56 which carries the intermediate voltage signal generated at node 50 of the auxiliary pump 42. The drains of transistors MP1 and MN1 are connected together, and the source of transistor MN1 is grounded.

Inverter IB1 includes p-channel MOS transistor MP3 and n-channel MOS transistor MN3. The gates of transistors MP3 and MN3 are both connected to line 68 which carries complementary clock signal $\Phi_2$. The source of transistor MP3 is connected to line 56 which carries the intermediate voltage signal generated at node 50 of the auxiliary pump 42. The drains of transistors MP3 and MN3 are connected together, and the source of transistor MN3 is grounded.

Inverter IA2, which includes p-channel MOS transistor MP2 and n-channel MOS transistor MN2, receives the output of inverter IA1. Specifically, the gates of transistors MP2 and MN2 are both connected to line 86 which carries the output of inverter IA1. Similar to inverter IA1, the source of transistor MP2 is connected to line 58 which carries the intermediate voltage signal generated at node 52 of the auxiliary pump 42. The drains of transistors MP2 and MN2 are connected together, and the source of transistor MN2 is grounded.

Inverter IB2, which includes p-channel MOS transistor MP4 and n-channel MOS transistor MN4, receives the output of inverter IB1. Specifically, the gates of transistors MP4 and MN4 are both connected to line 88 which carries the output of inverter IB1. Similar to inverter IB1, the source of transistor MP4 is connected to line 58 which carries the intermediate voltage signal generated at node 52 of the auxiliary pump 42. The drains of transistors MP4 and MN4 are connected together, and the source of transistor MN4 is grounded.

The general operation of a CMOS inverter is well known. Using inverter IA1 as an example, complementary clock signal $\Phi_1$, which is received at the gates of transistors MP1 and MN1 via line 66, will switch only one of these transistors on at a time. When complementary clock signal $\Phi_1$ is high, i.e., equal to Vcc, transistor MP1 will switch off and transistor MN1 will switch on, pulling line 86 low. When complementary clock signal $\Phi_1$ is low, i.e., equal to ground potential, transistor MP1 will switch on and transistor MN1 will switch off, pulling line 86 high.

Inverters IA1, IA2, IB1, and IB2 function somewhat differently than conventional CMOS inverters because they are powered by the increasingly higher intermediate voltage signals via lines 56 and 58. Thus, when p-channel transistors MP1 and MP3 switch on, lines 86 and 88 are pulled up to Vcc+$\Delta$, and when p-channel transistors MP2 and MP4 switch on, lines 90 and 92 are pulled up to Vcc+2$\Delta$. By powering each successive inverter with a slightly greater amplitude voltage supply signal, the amplitudes of the complementary clock signals $\Phi_1$ and $\Phi_2$ are gradually increased. When z inverters are used for the first and second set of inverters in the buffer stage 44, as shown in FIG. 3, the amplitude of the increased amplitude complementary clock signals $\Phi_1+$ and $\Phi_2+$ is Vcc+2$\Delta$.

On initial analysis, one may believe that the amplitude of the complementary clock signals $\Phi_1$ and $\Phi_2$ could be increased to $\Phi_1+$ and $\Phi_2+$ by using only a single inverter that is powered by a voltage supply signal having an amplitude of Vcc+z$\Delta$. An attempt to increase the amplitude of a clock signal by such a large amount with only a single inverter would result in the p-channel MOS transistor not cutting off when the n-channel MOS transistor switches on. If both transistors are switched on at the same time, current flows from the voltage supply, through both transistors, to ground potential. This "totem-pole current" greatly increases power dissipation which results in a much less efficient charge pump.

In order to avoid totem-pole currents in the inverters, $\Delta$ must be less than the threshold voltage of the p-channel MOS transistors. It follows that if $\Delta$ must remain small to avoid totem-pole currents, a single inverter can increase the amplitude of a clock signal by only a small amount. Thus, several series-connected inverters are needed in order to gradually increase the amplitude of the clock signals $\Phi_1$ and $\Phi_2$ to $\Phi_1+$ and $\Phi_2+$. Additionally, filter capacitors C16 and C17 control the size of $\Delta$ to ensure that it remains less than the threshold voltage of the p-channel transistors.

Diodes D7, D8, D9, and Dx of auxiliary pump 42, and diodes D11, D12, D13, and Dy of main pump 46 are preferably implemented with diode-connected MOS transistors. Furthermore, capacitors C8, C9, and Cx of auxiliary pump 42, capacitors C12, C13, and Cy of main pump 46, and filter capacitors C16, C17, and Cz are preferably implemented with capacitor-connected MOS transistors. These implementations are preferred because MOS transistors are more efficiently implemented in silicon than capacitors and diodes with unconstrained terminals.

Figure 5:
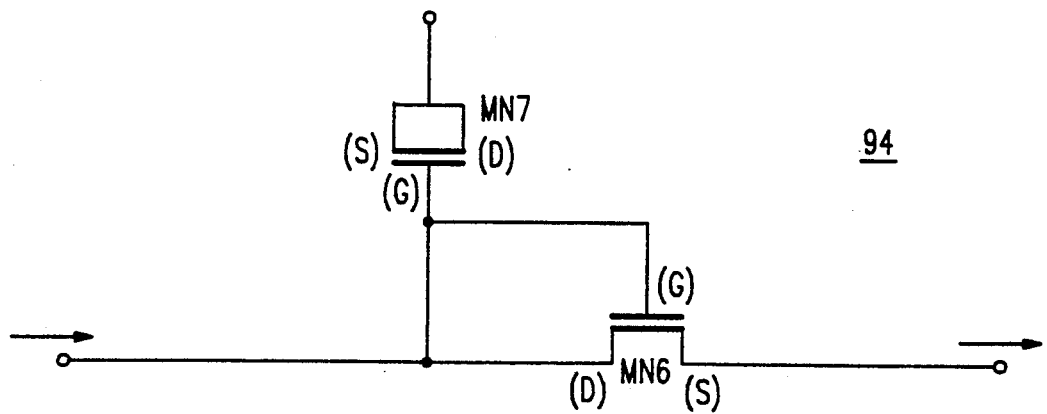
FIG. 5 is a schematic diagram illustrating one embodiment of the pump stages shown in FIG. 3.

Referring to FIG. 5, there is illustrated a pump stage 94 which may be used for any or all of the auxiliary pump stages 74, 76, and 78, or any or all of the main pump stages 80, 82, and 84. The pump stage 94 includes a diode-connected n-channel MOS transistor MN6 and a capacitor-connected n-channel MOS transistor MN7. Transistor MN6 is preferably a native transistor which has a threshold voltage of approximately 0.2-0.3 Volts. Transistor MN7 is preferably a depletion transistor which has a threshold voltage of approximately $-1.0$ Volt. Transistor MN7 will almost always have a conducting channel from drain to source for the voltage levels involved in the present invention.

The diode-connected transistor MN6 has its gate connected to its drain which provides the diode function of unidirectional conduction from drain to source. The capacitor-connected transistor MN7 has its source connected to its drain which provides the capacitor function of storing electric charge between the gate and the drain/source.

The pump stage 94 is configured by connecting the gate of the capacitor-connected transistor MN7 to the drain of diode-connected transistor MN6. This configuration is roughly equivalent to connecting one terminal of a capacitor to the anode of a diode. Thus, pump stage 94 may be readily substituted for any of auxiliary pump stages 74, 76, and 78, as well as any of main pump stages 80, 82, and 84. When substituted, the drain/source of transistor MN7 is connected to one of the pair of complementary clock signals $\Phi_1$ and $\Phi_2$ (or $\Phi_1+$ and $\Phi_2+$ if used in main pump 46), and diode-connected transistor MN6 is connected in series with the other diode-connected transistors.

Figure 6:
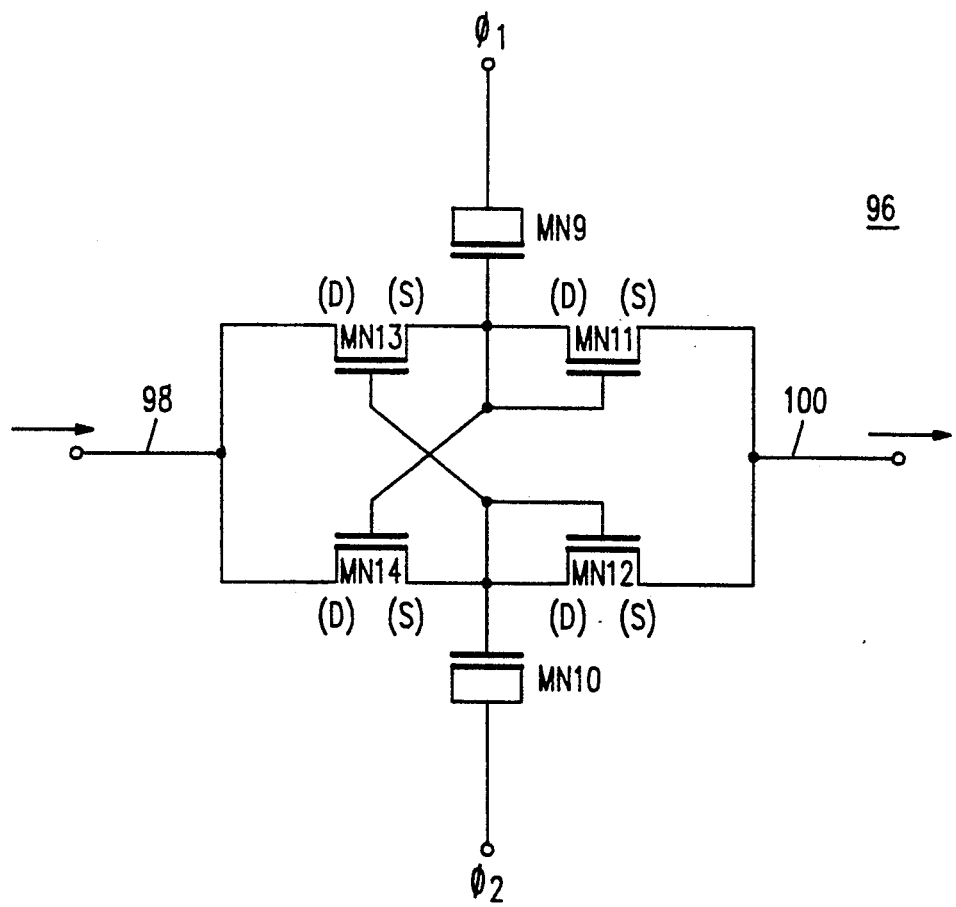
FIG. 6 is a schematic diagram illustrating another embodiment of the pump stages shown in FIG. 3.

Referring to FIG. 6, there is illustrated an alternative pump stage 96. Pump stage 96, which is known in the art, is preferably used for auxiliary pump stages 74, 76, and 78 because it provides a smoother, reduced ripple output. However, pump stage 96 may also be used for main pump stages 80, 82, and 84. Pump stage 96 provides unidirectional conduction from node 98 to node 100. Unlike pump stage 94, which utilizes only one of the pair of complementary clock signals $\Phi_1$ and $\Phi_2$, pump stage 96 utilizes both of the complementary clock signals $\Phi_1$ and $\Phi_2$.

Specifically, pump stage 96 includes two capacitor-connected n-channel MOS transistors MN9 and MN10 which have their source/drains connected to complementary clock signals $\Phi_1$ and $\Phi_2$, respectively. Two diode-connected n-channel MOS transistors MN11 and MN12 have their gate/drains connected to the gates of transistors MN9 and MN10, respectively. The sources of transistors MN11 and MN12 form output node 100.

Finally, two n-channel MOS transistors MN13 and MN14 have their sources connected to the drains of transistors MN11 and MN12, respectively, and their drains connected together to form input node 98. The gate of transistor MN13 is connected to the gate of transistor MN12, and the gate of transistor MN14 is connected to the gate of transistor MN11.

During operation, transistors MN13 and MN14 alternate between on and off states. When transistor MN13 is switched on, capacitor-connected transistor MN9 charges. When transistor MN14 is switched on, capacitor-connected transistor MN10 charges. Because clock signals $\Phi_1$ and $\Phi_2$ are complementary, capacitor-connected transistor MN9 discharges every half clock cycle, and capacitor-connected transistor MN10 discharges during the other half clock cycle. Thus, charge is being "pumped" out of node 100 during the entire clock cycle instead of just every half clock cycle like pump stages 74, 76, 78, 80, 82, 84, and 94.

The constant pumping of pump stage 96 during the entire clock cycle is what provides the smoother output. The smoother and reduced ripple output provides a more constant $\Delta$ in the intermediate voltage signals carried by lines 56, 58, and 60 generated by auxiliary pump 42. Having fewer irregularities in the $\Delta$ provides cleaner output signals in the CMOS inverters IA1, IA2, IAz, IB1, IB2, and IBz.

Referring back to FIG. 3, when the voltage supply signal Vcc is 2 Volts, the charge pump 40 is sufficient for generating the high programming/erase voltage signals Vpp required by non-volatile memories. In this scenario, i.e., Vcc=2 Volts, it is preferred that approximately 4 auxiliary pump stages be utilized in auxiliary pump 42. It is believed that the incremental voltage increase $\Delta$ will be approximately 0.5 Volts. The 4 auxiliary pump stages will produce an equal number of intermediate voltage signals which will supply power to an equal number of inverters in each of the first and second set of series-connected inverters in the buffer stage 44. The resulting increased amplitude complementary clock signals $\Phi_1+$ and $\Phi_2+$ will have amplitudes of approximately 4 Volts. The main pump 46 preferably includes approximately 14 main pump stages. The resulting programming/erase voltage signal Vpp will have a value of approximately 15 Volts.

It is believed that the charge pump 40 will operate on a wide range of voltage supply signals, not just Vcc=2 Volts. Although the preferred approximate number of pump stages has been given for Vcc=2 Volts, it should be understood that the number of pump stages may change as the voltage supply signal Vcc changes.

Figure 7:
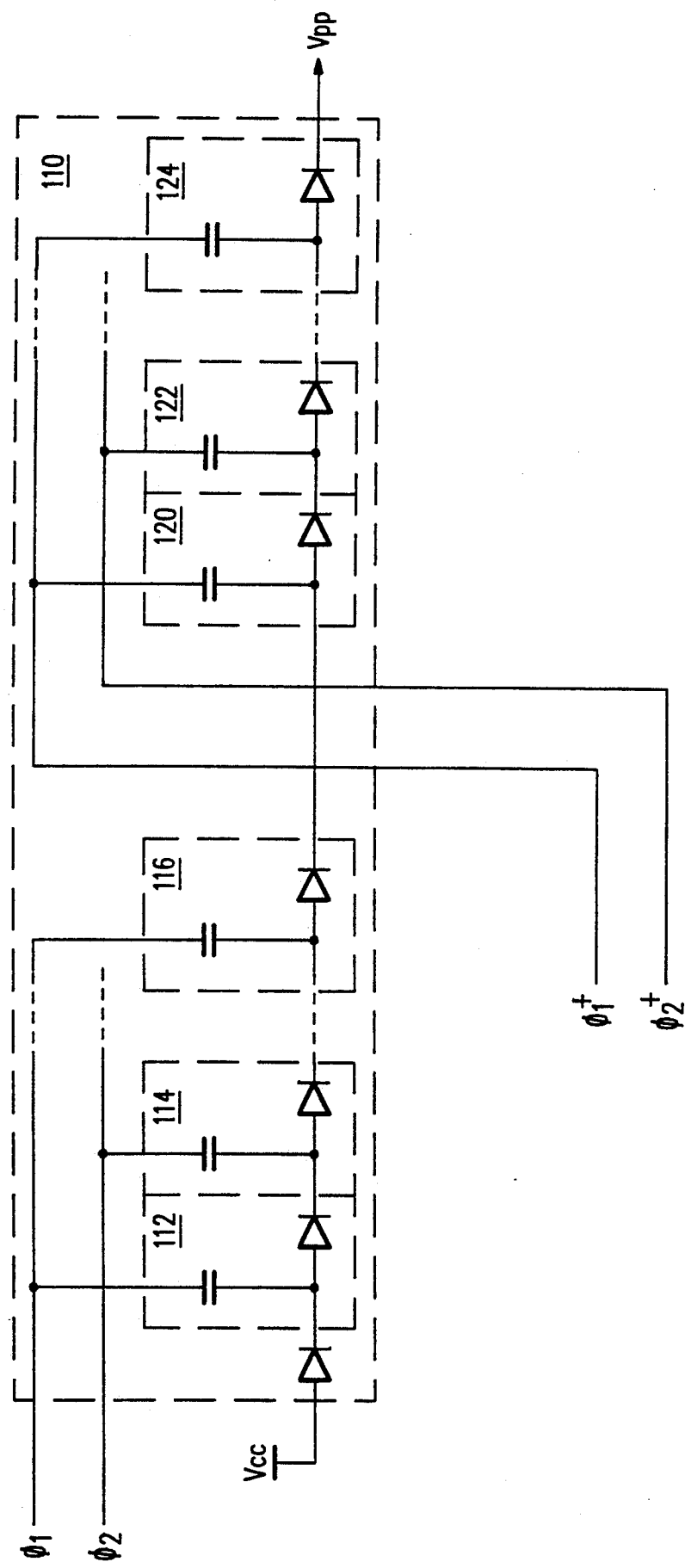
FIG. 7 is a schematic diagram illustrating an alternative embodiment of the main pump stage shown in FIG. 3.

Referring to FIG. 7, there is illustrated an alternative embodiment of main pump 46 shown in FIG. 3. Alternative main pump 110 utilizes both pairs of complementary clock signals $\Phi_1$ and $\Phi_2$ and $\Phi_1+$ and $\Phi_2+$. Specifically, the lower pump stages 112, 114, and 116 utilize complementary clock signals $\Phi_1$ and $\Phi_2$, and the upper pump stages 120, 122, and 124 utilize increased amplitude complementary clock signals $\Phi_1+$ and $\Phi_2+$. Current demand on the increased amplitude complementary clock signals $\Phi_1+$ and $\Phi_2+$ is decreased by using them only for the upper stages of the main pump 110.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A charge pump for increasing the amplitude of a voltage supply signal, the charge pump comprising:
   an auxiliary pump that is connected to receive the voltage supply signal and that responds to a first and a second complementary clock signals by generating a plurality of intermediate voltage signals, each of the intermediate voltage signals having a different amplitude which amplitude is greater than the amplitude of the voltage supply signal;
   buffer means for increasing the amplitudes of the first and second complementary clock signals in response to the plurality of intermediate voltage signals; and
   a main pump that increases the amplitude of the voltage supply signal in response to the first and second increased amplitude complementary clock signals.

2. The charge pump of claim 1, wherein the buffer means comprises:
   a plurality of series-connected first inverters responsive to the first complementary clock signal, each of the first inverters being powered by a corresponding one of the plurality of intermediate voltage signals; and
   a plurality of series-connected second inverters responsive to the second complementary clock signal, each of the second inverters being powered by a corresponding one of the plurality of intermediate voltage signals.

3. The charge pump of claim 2, wherein the buffer means further comprises:
   a plurality of filter capacitors, each filter capacitor being coupled between a different one of the plurality of intermediate voltage signals and ground potential.

4. The charge pump of claim 2, wherein the first and second inverters comprise CMOS inverters.

5. The charge pump of claim 1, wherein the auxiliary pump comprises:
   a plurality of series-connected diode means for providing unidirectional conduction, each of the diode means having an anode; and
   a plurality of capacitor means for storing electric charge, each of the capacitor means being coupled between one of the complementary clock signals and the anode of one of the diode means.

6. The charge pump of claim 5, wherein:
   each of the diode means comprises a diode-connected transistor; and
   each of the capacitor means comprises a capacitor-connected transistor.

7. The charge pump of claim 1, wherein the main pump comprises:
   a plurality of series-connected diode means for providing unidirectional conduction, each of the diode means having an anode; and
   a plurality of capacitor means for storing electric charge, each of the capacitor means being coupled between one of the increased amplitude complementary clock signals and the anode of one of the diode means.

8. The charge pump of claim 7, wherein:
   each of the diode means comprises a diode-connected transistor; and
   each of the capacitor means comprises a capacitor-connected transistor.

9. A charge pump for increasing the amplitude of a voltage supply signal, the charge pump comprising:
   a plurality of auxiliary pump stages for generating a plurality of intermediate voltage signals having different amplitudes which amplitudes are all greater than the amplitude of the voltage supply signal, each of the plurality of auxiliary pump stages being responsive to at least one of a pair of complementary clock signals;
   a plurality of first buffers for increasing the amplitude of one of the complementary clock signals, each of the first buffers being responsive to a different one of the plurality of intermediate voltage signals;
   a plurality of second buffers for increasing the amplitude of the other complementary clock signal, each of the second buffers being responsive to a different one of the plurality of intermediate voltage signals; and
   a plurality of main pump stages for increasing the amplitude of the voltage supply signal, each of the plurality of main pump stages being responsive to at least one of the increased amplitude complementary clock signals generated by the first and second buffer means.

10. The charge pump of claim 9, further comprising:
    a plurality of filter capacitors, each filter capacitor being coupled between a different one of the plurality of intermediate voltage signals and ground potential.

11. The charge pump of claim 9, wherein:
    the plurality of first buffers comprises a plurality of series-connected first CMOS inverters, each of the first CMOS inverters being powered by a different one of the plurality of intermediate voltage signals; and
    the plurality of second buffers comprises a plurality of series-connected second CMOS inverters, each of the second CMOS inverters being powered by a different one of the plurality of intermediate voltage signals.

12. The charge pump of claim 9, wherein each of the auxiliary pump stages comprises:
    a diode means for providing unidirectional conduction, the diode means having an anode and a cathode; and
    a capacitor means for storing electric charge, the capacitor means being coupled between the anode of the diode means and one of the complementary clock signals.

13. The charge pump of claim 12, wherein:
    the diode means comprises a diode-connected transistor; and
    the capacitor means comprises a capacitor-connected transistor.

14. The charge pump of claim 9, wherein each of the plurality of main pump stages comprises:
    a diode means for providing unidirectional conduction, the diode means having an anode and a cathode; and
    a capacitor means for storing electric charge, the capacitor means being coupled between the anode of the diode means and one of the increased amplitude complementary clock signals.

15. The charge pump of claim 14, wherein:
    the diode means comprises a diode-connected transistor; and
    the capacitor means comprises a capacitor-connected transistor.

16. A charge pump for increasing the amplitude of a voltage supply signal, the charge pump comprising:

an auxiliary pump having a plurality of series-connected auxiliary pump stages for generating a plurality of intermediate voltage signals, each of the intermediate voltage signals having a different amplitude which amplitude is greater than the amplitude of the voltage supply signal, each of the auxiliary pump stages being responsive to at least one of a pair of complementary clock signals;

a plurality of series-connected first inverters for increasing the amplitude of one of the complementary clock signals, each of the first inverters being powered by a different one of the plurality of intermediate voltage signals;

a plurality of series-connected second inverters for increasing the amplitude of the other complementary clock signal, each of the second inverters being powered by a different one of the plurality of intermediate voltage signals; and a main pump having a plurality of series-connected main pump stages for increasing the amplitude of the voltage supply signal, each of the main pump stages being responsive to at least one of the increased amplitude complementary clock signals.

17. The charge pump of claim 16, further comprising:
a plurality of filter capacitors, each filter capacitor being coupled between a different one of the plurality of intermediate voltage signals and ground potential.

18. The charge pump of claim 16, wherein the first and second inverters comprise CMOS inverters.

19. The charge pump of claim 16, wherein each of the auxiliary pump stages comprises:
a diode-connected transistor; and
a capacitor-connected transistor coupled between the drain of the diode-connected transistor and one of the complementary clock signals.

20. The charge pump of claim 16, wherein each of the main pump stages comprises:
a diode-connected transistor; and
a capacitor-connected transistor coupled between the drain of the diode-connected transistor and one of the increased amplitude complementary clock signals.

* * * * *